(12) United States Patent
Baek et al.

(10) Patent No.: US 11,549,979 B2
(45) Date of Patent: Jan. 10, 2023

(54) TEST METHOD FOR A SYSTEM ON CHIP AND A TEST SYSTEM FOR THE SYSTEM ON CHIP

(71) Applicant: SAMSUNG ELECTRONICS CO., LTD., Suwon-si (KR)

(72) Inventors: Hyun-Chul Baek, Suwon-si (KR); Yu Jin Oh, Ulsan (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/480,257

(22) Filed: Sep. 21, 2021

(65) Prior Publication Data

US 2022/0196730 A1 Jun. 23, 2022

(30) Foreign Application Priority Data

Dec. 23, 2020 (KR) .................. 10-2020-0181937

(51) Int. Cl.
*G01R 31/28* (2006.01)

(52) U.S. Cl.
CPC ............................... *G01R 31/2884* (2013.01)

(58) Field of Classification Search
CPC .......... G01R 31/2884; G01R 31/31718; G01R 31/3177; G06F 15/7807; G11C 29/56
USPC .................... 324/750.3, 537, 500
See application file for complete search history.

(56) References Cited

U.S. PATENT DOCUMENTS

| 7,404,161 | B2 | 7/2008 | Dutt et al. |
| 8,233,974 | B2* | 7/2012 | Ward .................. A61B 5/4878 600/547 |
| 8,327,309 | B2 | 12/2012 | Stuyt et al. |
| 8,413,088 | B1 | 4/2013 | Armbruster et al. |
| 8,823,405 | B1* | 9/2014 | Trimberger ........ G01R 31/3187 324/762.05 |
| 10,473,721 | B1 | 11/2019 | Cote et al. |
| 2016/0131697 | A1* | 5/2016 | Kang ..................... G11C 29/06 324/750.3 |

FOREIGN PATENT DOCUMENTS

JP 2006-185202 7/2006
KR 10-2006-0066634 6/2006

* cited by examiner

*Primary Examiner* — Giovanni Astacio-Oquendo
(74) *Attorney, Agent, or Firm* — F. Chau & Associates, LLC

(57) ABSTRACT

A test method for a system on chip, the test method including: receiving a system on chip including a plurality of blocks; booting up the system on chip; storing input values that are input to each of the plurality of blocks, while booting up the system on chip; and performing a test on a first block among the plurality of blocks, wherein performing the test on the first block includes: disabling components of each of the plurality of blocks except the first block, and inputting a first input value to the first block to initialize the first block, wherein the first input value is one of the stored input values that was input to the first block while booting-up the system on chip.

20 Claims, 12 Drawing Sheets

TEST METHOD FOR A SYSTEM ON CHIP AND A TEST SYSTEM FOR THE SYSTEM ON CHIP

CROSS-REFERENCE TO RELATED APPLICATION

This application claims priority under 35 U.S.C. § 119 to Korean Patent Application No. 10-2020-0181937 filed on Dec. 23, 2020 in the Korean Intellectual Property Office, the disclosure of which is incorporated by reference herein in its entirety.

TECHNICAL FIELD

The present disclosure relates to a test method for a system on chip and a test system for the system on chip.

DESCRIPTION OF THE RELATED ART

As people live and work more intensively with digital communications, electronic apparatuses have become smaller, highly functional and able to store large amounts of data. Accordingly, the degree of integration of semiconductor devices included in the electronic apparatuses increases. With the increase in the degree of semiconductor device integration, the features for verifying semiconductor chips have also increased. As a result, the time spent verifying the semiconductor chips is increasing.

SUMMARY

According to an embodiment of the present disclosure, there is provided a test method for a system on chip, the test method including: receiving a system on chip including a plurality of blocks; booting up the system on chip; storing input values that are input to each of the plurality of blocks, while booting up the system on chip; and performing a test on a first block among the plurality of blocks, wherein performing the test on the first block includes: disabling components of each of the plurality of blocks except the first block, and inputting a first input value to the first block to initialize the first block, wherein the first input value is one of the stored input values that was input to the first block while booting-up the system on chip.

According to an embodiment of the present disclosure, there is provided a test system for a system on chip, the test system including: a processor; and a system on chip including a plurality of blocks, and a memory in which a test bench for performing a test on the system on chip is stored, wherein the test bench includes: an input port monitor that boots up the system on chip, and stores input values which are input to each of the plurality of blocks while the system on chip is booted up, an input driver that disables components of each of the plurality of blocks except a test block among the plurality of blocks, and inputs a first input value to be input into the test block during booting-up of the system on chip among the stored input values to the test block, thereby initializing the test block, and a verifier that performs verification on the test block on the basis of an operation result of the initialized test block.

According to an embodiment of the present disclosure, there is provided a test system for a system on chip, the test system including: a processor; and a system on chip including a plurality of blocks, and a memory in which a test bench for performing a test on the system on chip is stored, wherein the test bench includes: an input port monitor that boots up the system on chip, and stores input values to be input to each of the plurality of blocks while the system on chip is booted up, and an input driver, when performing the test on one block of the plurality of blocks, the input driver inputs the input value to be input to the one block during booting-up of the system on chip among the input values to the one block, and disables each component of the remaining blocks except the one block of the plurality of blocks, and when performing the test on the system on chip, the input driver inputs the input values to each of the plurality of blocks.

BRIEF DESCRIPTION OF THE DRAWINGS

The and other features of the present disclosure will become more apparent by describing in detail embodiments thereof referring to the attached drawings, in which.

DETAILED DESCRIPTION OF THE EMBODIMENTS

Figure 1:
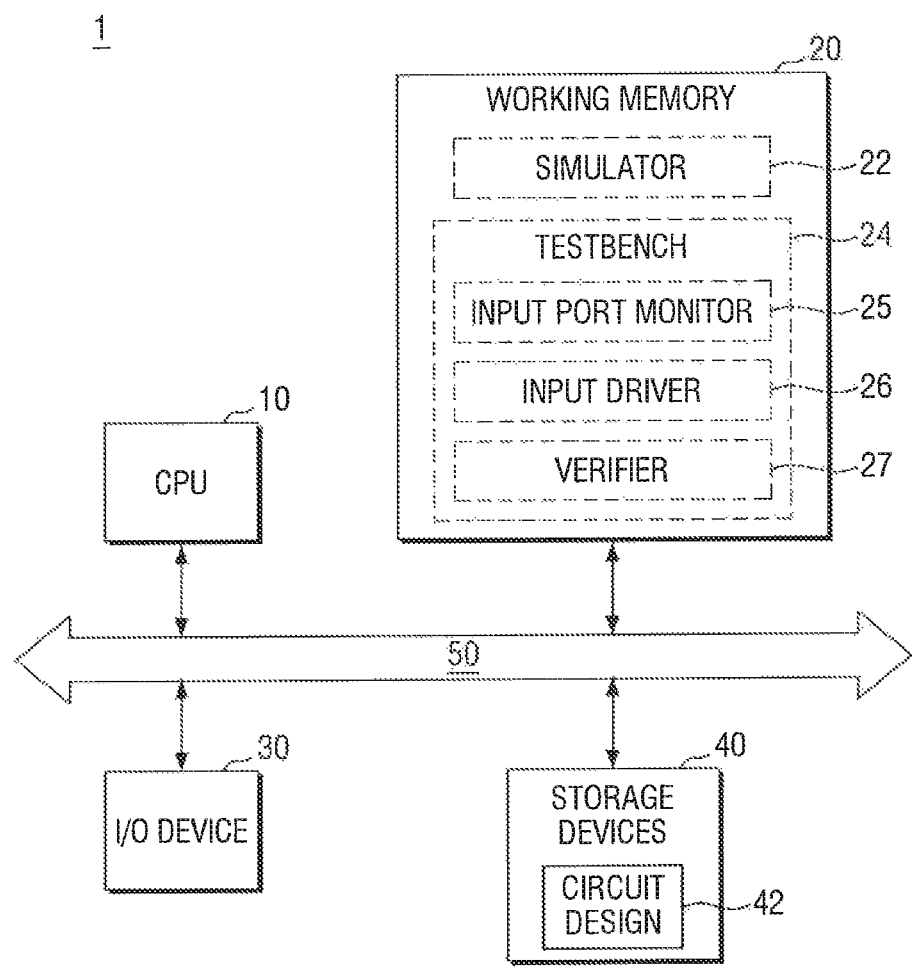
FIG. 1 is a diagram for explaining a test system for a system on chip according to embodiments of the present disclosure.

FIG. 1 is a diagram for explaining a test system for a system on chip according to embodiments of the present disclosure.

Referring to FIG. 1, a test system 1 for a system on chip according to embodiments of the present disclosure may include a central processing unit (CPU) 10, a working memory 20, an input/output (I/O) device 30, storage devices 40, and a system bus 50.

The CPU 10 may control the overall operations of the test system 1, and for example, the operation of the components included in the test system 1. The CPU 10 may execute software (e.g., application programs, operating systems, device drivers and the like) to be executed on the test system 1. The CPU 10 may execute the operating system (OS) loaded into the working memory 20. The CPU 10 may execute various application programs to be driven on the basis of the operating system (OS). The CPU 10 may be implemented, for example, by a general purpose processor, a dedicated processor, an application processor, or the like.

The operating system (OS) or application programs may be loaded into the working memory 20. An OS image stored in an auxiliary storage device may be loaded into the working memory 20 on the basis of a booting sequence, when the computer system is booted up. The operating system (OS) may support various I/O operations of the computer system.

The application programs may also be loaded into the working memory 20 to be selected by a user or to provide basic services. A simulator 22 and a test bench 24 may be loaded into the working memory 20. The CPU 10 may execute the simulator 22 and test bench 24 loaded into the working memory 20.

The simulator 22 may implement a system on chip, by utilizing a circuit design 42 stored in the storage devices 40.

The test bench 24 may perform a test operation on the system on chip implemented in the simulator 22. The test bench 24 may perform the test operation on the system on chip and the test operation on blocks included in the system on chip. The test bench 24 may perform the test operation within a system on chip range and the test operation within a block range in the system on chip.

An input port monitor 25 may sample and store the input values that are input to the system on chip when the system on chip implemented on the simulator 22 is booted up. An input driver 26 may reproduce the input value on the basis of the input values stored in the input port monitor 25. The input driver 26 may input the reproduced input value to the system on chip. A verifier 27 may perform the verification operation on the system on chip after the system on chip, to which the input value from the input driver 26 is input, operates.

The I/O device 30 may receive a user input from user interface devices. The I/O device 30 may be, for example, a touch pad, a keypad, a keyboard, a mouse, and/or a microphone.

The storage devices 40 may function as non-volatile storage devices that store data, regardless of whether power is supplied. The storage devices 40 may store the circuit design 42.

The storage devices 40 may include, for example, a non-volatile memory such as an EEPROM (Electrically Erasable Programmable Read-Only Memory), a flash memory, a PRAM (Phase Change Random Access Memory), a RRAM (Resistance Random Access Memory), an NFGM (Nano Floating Gate Memory), a PoRAM (Polymer Random Access Memory), a MRAM (Magnetic Random Access Memory), and a FRAM (Ferroelectric Random Access Memory), and may also include a storage medium such as a magnetic tape, an optical disk, and a magnetic disk. In addition, the storage devices 40 may be detachable from the test system 1. The storage devices 40 may be devices to which standard conventions such as UFS (universal flash storage), eMMC (embedded multi-media card) or NVMe (non-volatile memory express apply) are applied, but are not limited thereto.

Figure 2:
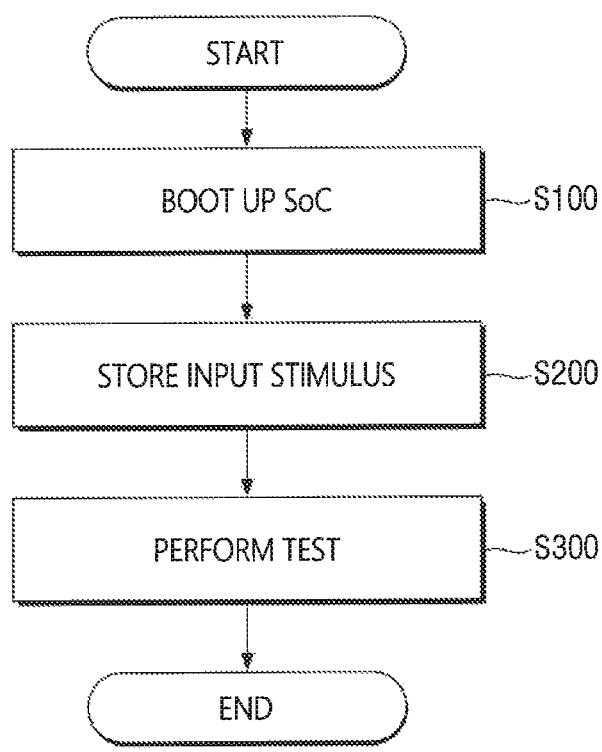
FIG. 2 is a flowchart for explaining a test method for a system on chip according to embodiments of the present disclosure.

FIG. 2 is a flowchart for explaining the test method for a system on chip according to embodiments of the present disclosure. FIGS. 3 to 8 are diagrams for explaining the test method for a system on chip according to embodiments of the present disclosure.

Referring to FIGS. 1 and 2, the test method for a system on chip according to embodiments of the present disclosure may boot up the system on chip implemented by the simulator 22 (S100).

The simulator 22 may implement, for example, the system on chip from the circuit design 42 stored in the storage devices 40. In another example, the simulator 22 may implement the system on chip that is input from outside.

Figure 3:
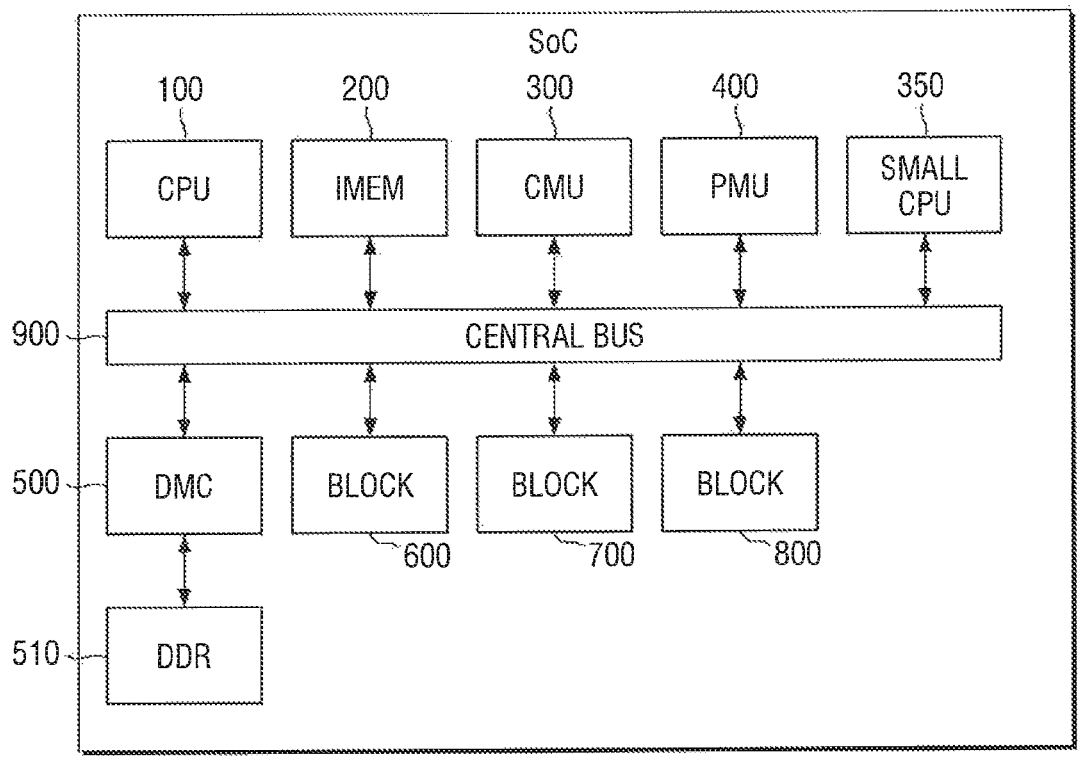
FIG. 3 is a diagram for explaining the test method for a system on chip according to embodiments of the present disclosure.

FIG. 3 is a diagram for explaining the system on chip implemented by the simulator 22. Referring to FIG. 3, the system on chip may include a plurality of blocks 100, 200, 300, 350, 400, 500, 510, 600, 700, and 800, and a central bus 900.

The system on chip may be, for example, a modem chip that may send and receive radio signals through an antenna, an application processor used for a mobile device, and the like.

The plurality of blocks 100, 200, 300, 350, 400, 500, 510, 600, 700, and 800 may be connected to each other through the central bus 900. The plurality of blocks 100, 200, 300, 350, 400, 500, 510, 600, 700, and 800 may operate by exchanging data or commands through the central bus 900. The central bus 900 may include a plurality of interfaces connected to the plurality of blocks 100, 200, 300, 350, 400, 500, 510, 600, 700, and 800.

Each of the plurality of blocks 100, 200, 300, 350, 400, 500, 510, 600, 700, and 800 may include at least one IP address, and may perform a particular operation. An IP may be a functional block that performs a particular function. Each of the plurality of blocks 100, 200, 300, 350, 400, 500, 510, 600, 700, and 800 may include at least one IP address, depending on the user's intention.

The plurality of blocks 100, 200, 300, 350, 400, 500, 510, 600, 700, and 800 may include, for example, a CPU block 100, an internal memory block 200, a clock management unit (CMU) block 300, a small CPU 350, a power management unit (PMU) block 400, a dynamic memory controller (DMC) block 500, a double data rate (DDR) interface block 510, and first to third blocks 600, 700, and 800. The present disclosure is not limited thereto, and each of the blocks 100, 200, 300, 350, 400, 500, 510, 600, 700, and 800 may be, for example, a calculation processing unit that processes calculations, an interface unit that executes operations related to the interface in the system on chip, a camera processing unit that executes operations related to a camera, a display unit that executes operations related to a display, and the like.

The CPU block 100 may control the overall operations of the system on chip. The CPU block 100 may include at least one IP address, and the IP may be, for example, a CPU, a processing unit, a debugging controller, a memory, or the like.

The internal memory block 200 may include at least one IP address, and the IP may be, for example, a direct memory access (DMA) that may directly access an internal memory, a memory in the system on chip, and the like.

The CMU block 300 may generate a clock signal and provide it to the plurality of blocks 100, 200, 350, 400, 500, 510, 600, 700, and 800. The CMU block 300 may include at least one IP address, and the IP may be, for example, a phase locked loop (PLL), a delayed locked loop (DLL), a crystal oscillator or the like.

The PMU block 400 may supply power to the plurality of blocks 100, 200, 350, 400, 500, 510, 600, 700, and 800 in the system on chip, according to the operations or features of the plurality of blocks 100, 200, 350, 500, 510, 600, 700, and 800. In addition, the PMU block 400 may provide a reset signal to the plurality of blocks 100, 200, 300, 350, 500, 510, 600, 700, and 800 in the system on chip.

The CMU block 300 and the PMU block 400 may be controlled by the small CPU 350. Alternatively, the CMU block 300 and the PMU block 400 may be controlled by the CPU block 100, and the small CPU 350 may be omitted.

The DMC block 500 may control a dynamic random access memory (DRAM) connected to the system on chip. The DDR interface block 510 may perform interface operations between the DRAM connected to the system on chip and the DMC block 500.

Figure 4:
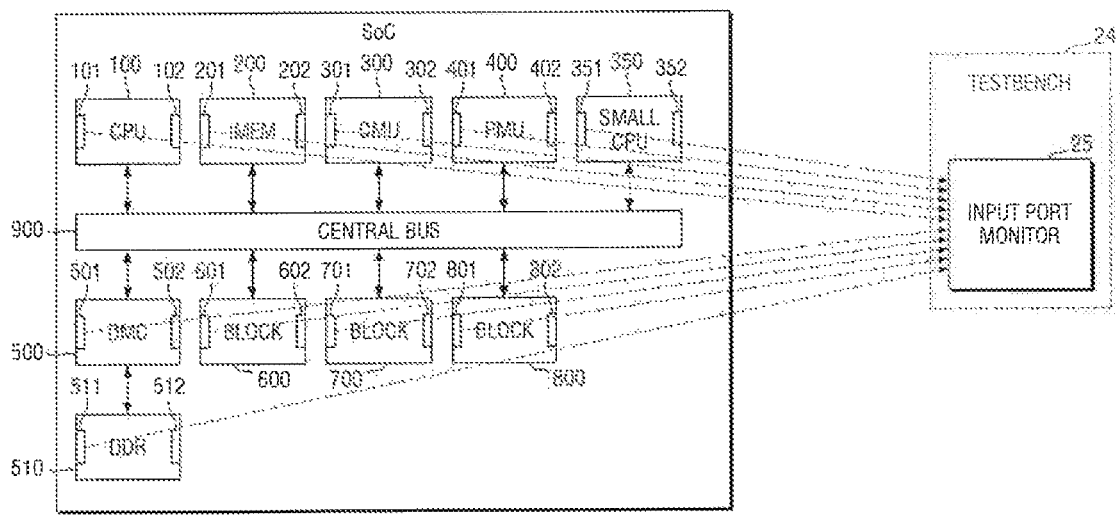
FIG. 4 is a diagram for explaining the test method for a system on chip according to embodiments of the present disclosure.

Next, referring to FIGS. 2 and 4, the input port monitor 25 may store input stimulus that is input to each of the blocks 100, 200, 350, 400, 500, 510, 600, 700, and 800 while the system on chip is booted up (S200). The input stimulus may be input values that are input to each of the blocks 100, 200, 350, 400, 500, 510, 600, 700, and 800, while the system on chip is booted up.

Each of the blocks 100, 200, 350, 400, 500, 510, 600, 700, and 800 in the system on chip may include, for example, input ports 101, 201, 301, 401, 351, 501, 511, 601, 701, and 801, and output ports 102, 202, 302, 402, 352, 502, 512, 602, 702, and 802. The input port monitor 25 may sample all the input values that are input to the input ports 101, 201, 301, 401, 351, 501, 511, 601, 701, and 801, while the system on chip is booted up. The input values may be provided from the blocks 100, 200, 350, 400, 500, 510, 600, 700, and 800 in the system on chip, or may be provided from outside of the system on chip.

The input port monitor 25 may also sample the input values that are input to the central bus 900.

The input values may include, for example, a clock signal and a reset signal to be input to each of the blocks 100, 200, 350, 400, 500, 510, 600, 700, and 800 while the system on chip is booted up, configuration signals of each of the blocks 100, 200, 350, 400, 500, 510, 600, 700, and 800, and the like. For example, in the case of the DMC block 500, the configuration signals may include the number of DRAMs connected to the DMC block 500, ID of the DRAM, information about a channel connected to the DRAM, parameters about the operation of the DRAM, and the like.

Each of the blocks 100, 200, 350, 400, 500, 510, 600, 700, and 800 may receive a clock signal, for example, from the CMU block 300 or outside of the system on chip. Each of the blocks 100, 200, 350, 400, 500, 510, 600, 700, and 800 may receive a reset signal, for example, from the PMU block 400 or outside of the system on chip.

Referring to FIG. 2 again, a test may be performed on the system on chip (S300).

Figure 5:
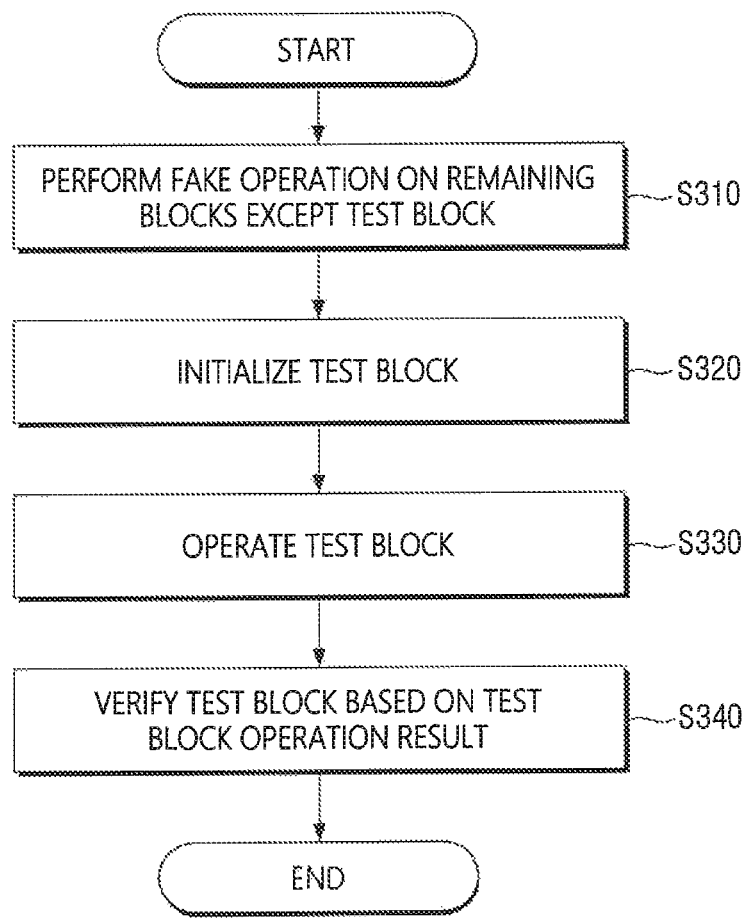
FIG. 5 is a diagram for explaining the test method for a system on chip according to embodiments of the present disclosure.
Figure 6:
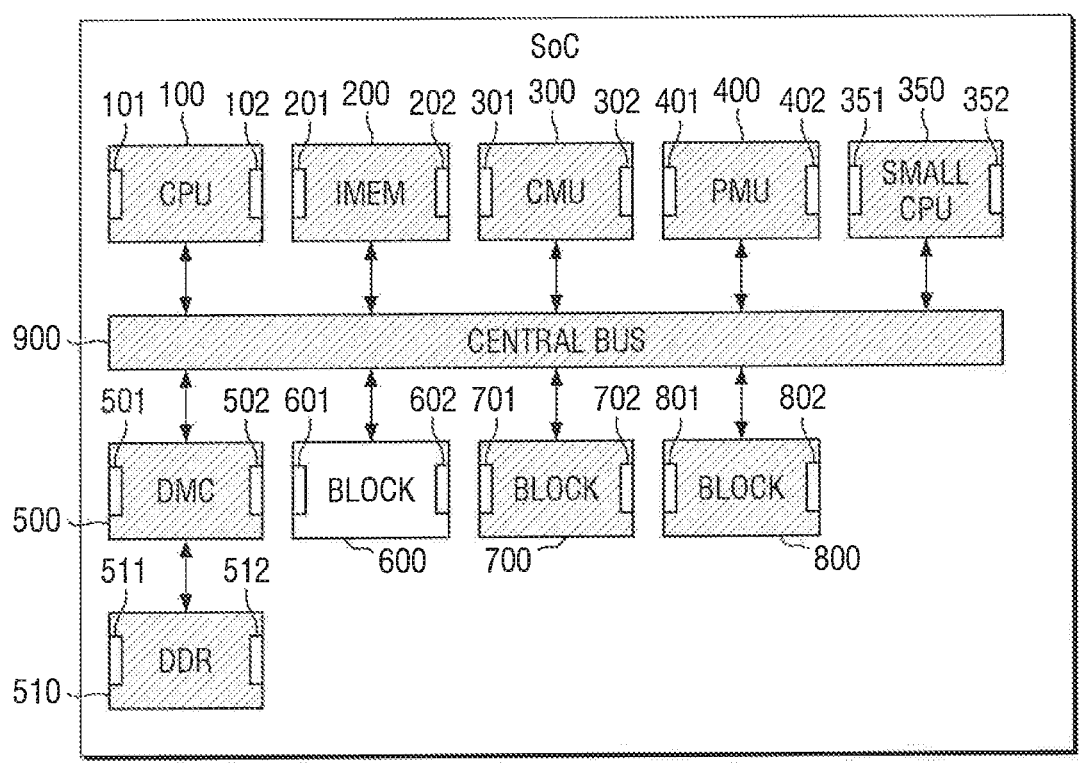
FIG. 6 is a diagram for explaining the test method for a system on chip according to embodiments of the present disclosure.
Figure 7:
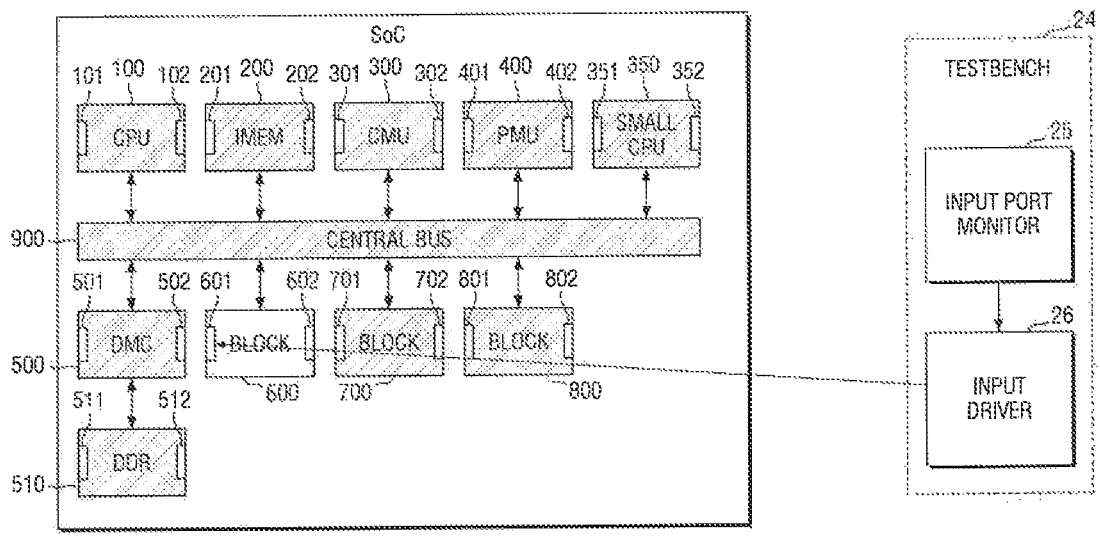
FIG. 7 is a diagram for explaining the test method for a system on chip according to embodiments of the present disclosure.
Figure 8:
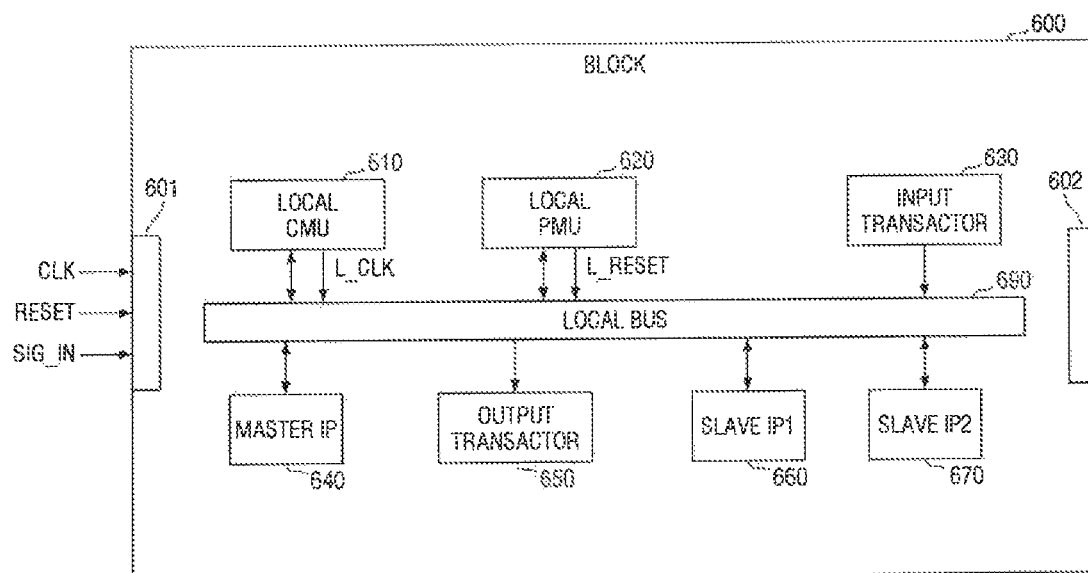
FIG. 8 is a diagram for explaining the test method for a system on chip according to embodiments of the present disclosure.

FIG. 5 is a flowchart for explaining step S300 of FIG. 2. FIGS. 6 to 8 are diagrams for explaining the operation of FIG. 5.

Referring to FIGS. 5 and 6, a fake operation may be performed on the remaining blocks except the test block (S310). In other words, a fake operation may be performed on all of the blocks, except the block actually being tested. The fake operation may be performed, for example, by a simulator (22 of FIG. 1).

For example, when the first block 600 is a test block, the fake operation may be performed on the remaining blocks 100, 200, 300, 350, 400, 500, 510, 700, and 800. The fake operation may be a deletion of all internal components of the blocks 100, 200, 300, 350, 400, 500, 510, 700, and 800. In other words, in the blocks 100, 200, 300, 350, 400, 500, 510, 700, 800 on which the fake operation is performed, all of the components except the input ports 101, 201, 301, 351, 401, 501, 511, 701, and 801, and the output ports 102, 202, 302, 352, 402, 502, 512, 702, and 802 may be deleted. The fake operation may include, for example, not connecting input and output transactors to the local bus of the respective blocks not being tested. In this case, input stimulus is not provided to the blocks other than the test block. Only the test block may receive an input stimulus. Thus, the blocks other than the test block may be disabled during the test.

The fake operation may also be performed on the central bus 900. In this case, all of the components in the central bus 900 may be removed, accordingly. For example, the central bus 900 may be disabled.

The system on chip may include an alive block that is always provided with power. The alive block may always be enabled, unless the entire power of the system on chip is shut off. In a test system for system on chip according to embodiments of the present disclosure, when the alive block is a test block, the alive block may be enabled. When the alive block is one of the remaining blocks except the test block, the fake operation may be performed on the alive block. All of the components in the alive block may be deleted, accordingly. Thus, when the entire power of the system on chip is shut off, or when a test operation is performed on a block other than the alive block, the alive block may be disabled. The alive block may be always enabled in other cases.

The alive block may include, for example, the CMU block 300, the PMU block 400, and the small CPU 350.

Hereinafter, the CMU block 600 will be described as a test block.

Referring to FIGS. 5, 7 and 8 the input driver 26 may initialize the test block (S320).

The input driver 26 may reproduce the input value that is input to the test block and input that value to the test block, while the system on chip is booted up. In other words, the input driver 26 may input the input value to the CMU block 600. The test block may be initialized accordingly. At this time, the input value may be a value stored in the input port monitor 25.

The input value may include, for example, at least one of a clock signal CLK, a reset signal RESET, and a setting or configuration signal SIG_IN that are input to the CMU block 600, while the system on chip is booted up. The configuration signal SIG_IN may include, for example, a first signal that is variable while the system on chip is booted up, and a second signal that has a fixed value while the system on chip is booted up. The first signal, which is variable while the system on chip is booted up, may have a fixed value after booting-up of system on chip ends. In addition, the first signal, which is variable while the system on chip is booted may then become fixed during the boot-up process. The input driver 26 may distinguish the toggled clock signal CLK, the first signal and the second signal.

The input driver 26 may reproduce the input value and input that value to the input port 601 of the CMU block 600. For example, the input driver 26 may reproduce the first signal having a fixed value and input the first signal to the input port 601 of the CMU block 600. On the other hand, in a block in which a fake operation is performed, the input driver 26 may not reproduce its input value and then input the reproduced value to the input port of the block.

The CMU block 600 may include, for example, a local CMU 610, a local PMU 620, a master IP 640, a first slave IP 660, a second slave IP 670, and a local bus 690. The local CMU 610, the local PMU 620, the master IP 640, the first slave IP 660 and the second slave IP 670 may be connected to each other through the local bus 690.

The local CMU 610 may provide a suitable local clock signal L_CLK according to the local PMU 620, the master IP 640, the first slave IP 660, the second slave IP 670 and the local bus 690, using the clock signal CLK. In other words, the local PMU 620, the master IP 640, the first slave IP 660, the second slave IP 670 and the local bus 690 may receive the same local clock signal L_CLK or may receive different local clock signals L_CLK from each other.

The local PMU 620 may provide a suitable local reset signal L_RESET according to the local PMU 620, the master IP 640, the first slave IP 660, the second slave IP 670 and the local bus 690, using the reset signal RESET. In addition, the local PMU 620 may supply a suitable power according to the local PMU 620, the master IP 640, the first slave IP 660, the second slave IP 670, and the local bus 690.

The master IP 640 may include, for example, a processor, a controller, and the like. The first slave IP 660 and the second slave IP 670 may include an internal memory device, an external memory interface, and the like.

The input driver 26 may connect an input transactor 630 and an output transactor 650 to the local bus 690 of the CMU block 600, inside the CMU block 600. The input transactor 630 may provide a transaction to the local bus 690, and the output transactor 650 may provide a response to the local bus 690.

Subsequently, the test block may operate (S330).

It is to be understood that the operation of the test block, e.g., the CMU block 600 is effectuated by the connection of the input transactor 630 and the output transactor 650 to its local bus 690. In contrast, the input and output transactors of the non-test blocks are not connected to their local buses, and thus, the non-test blocks are not tested. However, if more that one block is to be tested, its input and output transactors may be connected to its local bus so that it may operate in response to input stimulus. This test may occur simultaneous with the test of the first test block or after the test of the first test block.

Subsequently, the test block may be verified on the basis of the operation result of the test block (S340). Hereinafter, a detailed description of the foregoing will be given referring to FIGS. 9 to 12.

Figure 9:
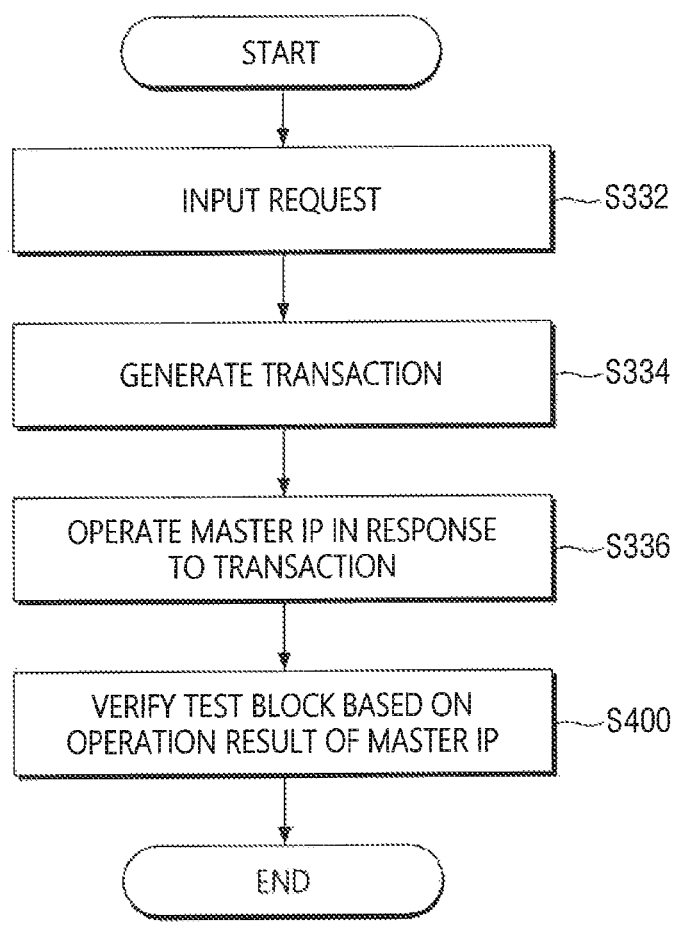
FIG. 9 is a flowchart for explaining steps S330 and S340 of FIG. 5.
Figure 10:
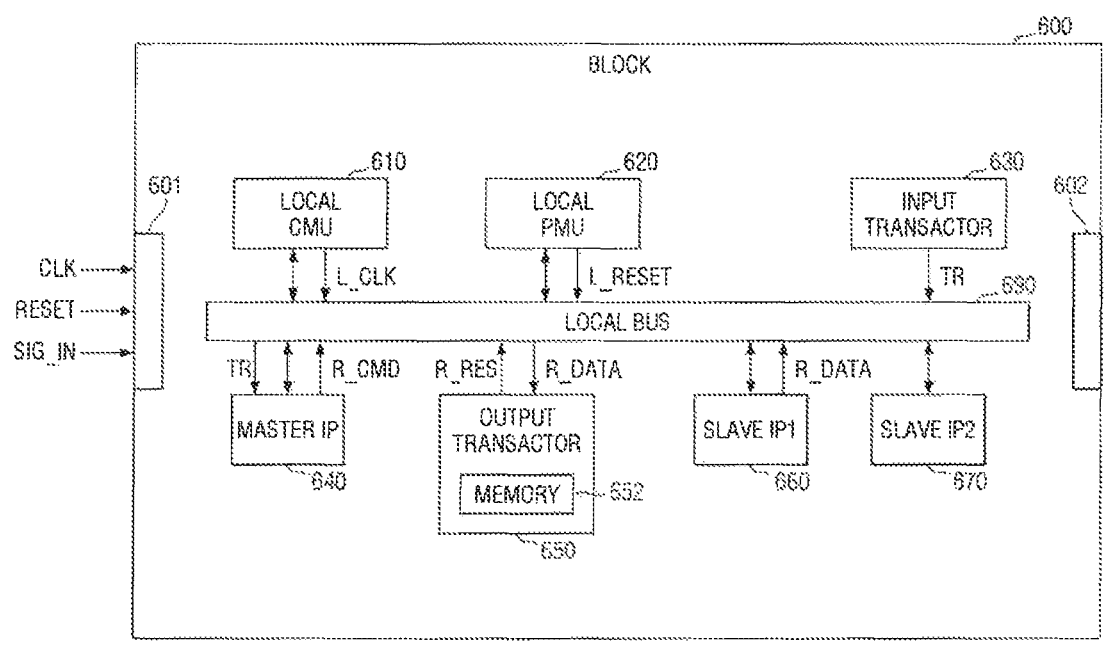
FIG. 10 is a diagram for explaining the operation of FIG. 9.
Figure 11:
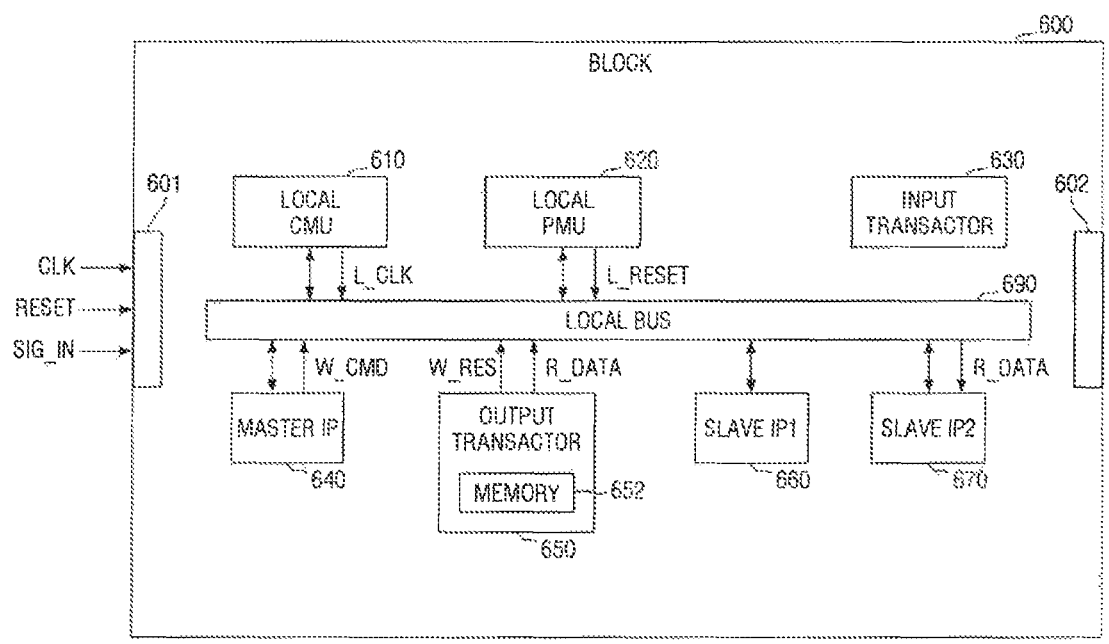
FIG. 11 is a diagram for explaining the operation of FIG. 9.
Figure 12:
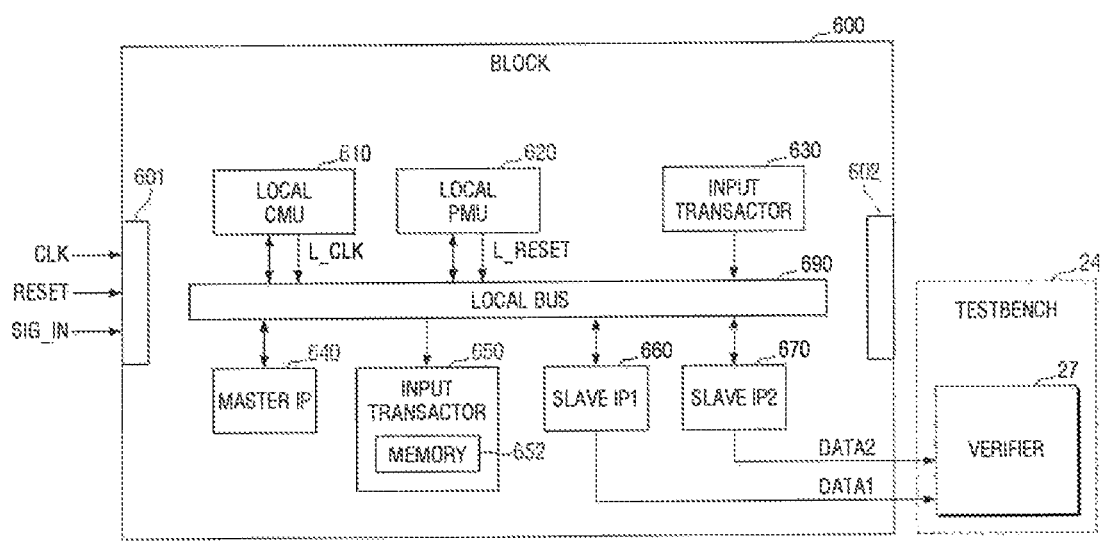
FIG. 12 is a diagram for explaining the operation of FIG. 9.

FIG. 9 is a flowchart for explaining steps S330 and S340 of FIG. 5. FIGS. 10 to 12 are diagrams for explaining the operation of FIG. 9.

Referring to FIGS. 9 to 11, a request may be input to the input transactor 630 from the outside (S332). For example, the request may be input from a user of the system through an API (Application Programming Interface). The request may include data, a write request including an address to which the data is written, a read request including an address from which the data is read, and the like.

Subsequently, the input transactor 630 may generate a transaction in response to the request (S334).

For example, when the first slave IP 660 and the second slave IP 670 are memories, the request of writing the data stored in the first address of the first slave IP 660 to the second address of the second slave IP 670 may be input. The input transactor 630 may generate a transaction TR in response to the request. The transaction TR may include a read command R_CMD including the first address and a write command W_CMD including the second address.

Subsequently, the master IP 640 may perform an operation according to the transaction TR in response to the transaction TR (S336).

Referring to FIG. 10, the master IP 640 may perform a read operation in response to the read command R_CMD. The master IP 640 may read data R_DATA from the first address of the first slave IP 660. The output transactor 650 may generate a response R_RES to the read operation after the read operation is performed. The output transactor 650 may generate a response R_RES after the read operation is performed on the first slave IP 660. The output transactor 650 may include a memory 652. The read data R_DATA may be stored in the memory 652 in the output transactor 650.

Referring to FIG. 11, the master IP 640 may perform a write operation in response to the write command W_CMD. The master IP 640 may write the data R_DATA on the second address of the second slave IP 670. The data R_DATA may be provided from the memory 652 in the output transactor 650. The output transactor 650 may generate a response W_RES to the write operation after the write operation is performed.

Subsequently, referring to FIGS. 9 and 12, the test block may be verified on the basis of the operation result of the master IP 640 (S340).

The verifier 27 may read the data DATA1 stored in the first address of the first slave IP 660 and the data DATA2 stored in the second address of the second slave IP 670, and verify the CMU block 600 on the basis of the DATA1 and DATA2. The verifier 27 may compare the data DATA1 stored in the first address of the first slave IP 660 with the data DATA2 stored in the second address of the second slave IP 670 to verify the CMU block 600.

The verifier 27 may select a verification path according to the transaction TR and determine the operation result of the master IP 640 according to the verification path. For example, when the transaction TR includes a command that reads data from the address of the first slave IP 660, the verifier 27 may select the verification path that reads the data from the address of the first slave IP 660 and reads the data from the output transactor 650. In this case, the verification path may be provided from, for example, the user interface devices.

When performing the test operation on the CMU block 600 (or test block), the test system for a system on chip according to embodiments of the present disclosure may perform the fake operation on the blocks 100, 200, 300, 350, 400, 500, 510, 700, and 800 other than the test block 600 and the central bus 900, and reproduce the input values to be input to the test block 600. Accordingly, since there is no need for a simulation time to operate the other blocks 100, 200, 300, 350, 400, 500, 510, 700, and 800 and the central bus 900 in the test environment of the system on chip, the test time of the test block 600 may be reduced. Further, the test range may be reduced to the test block 600, by connecting the input transistor 630 that generates a transaction and the output transactor 650 that generates a response inside the test block 600.

Figure 13:
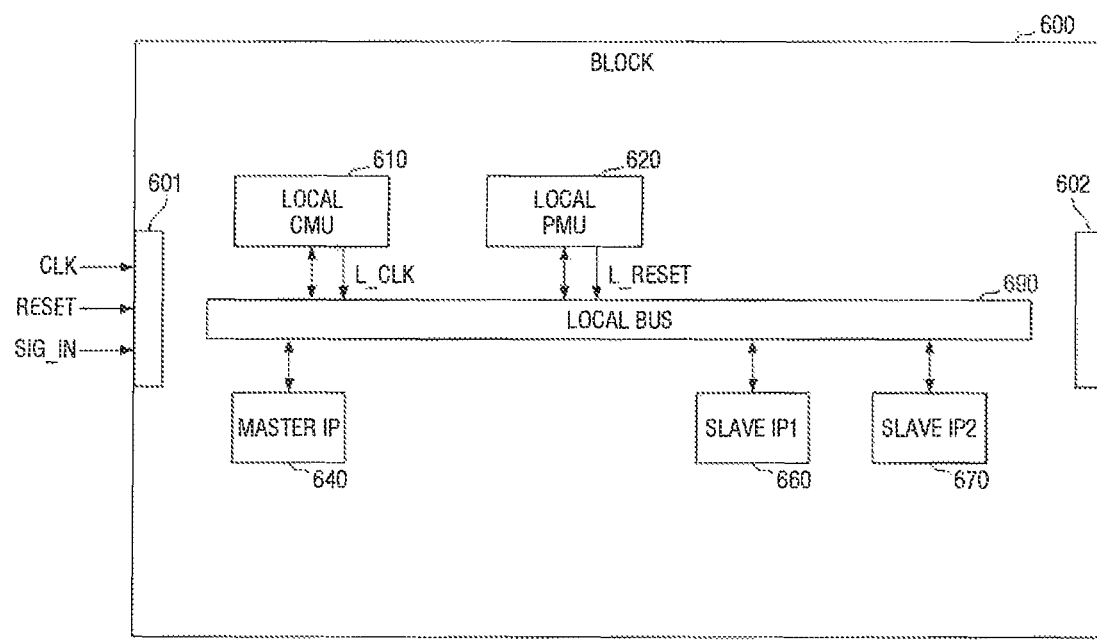
FIG. 13 is a diagram for explaining a test method for a system on chip according to embodiments of the present disclosure.
Figure 14:
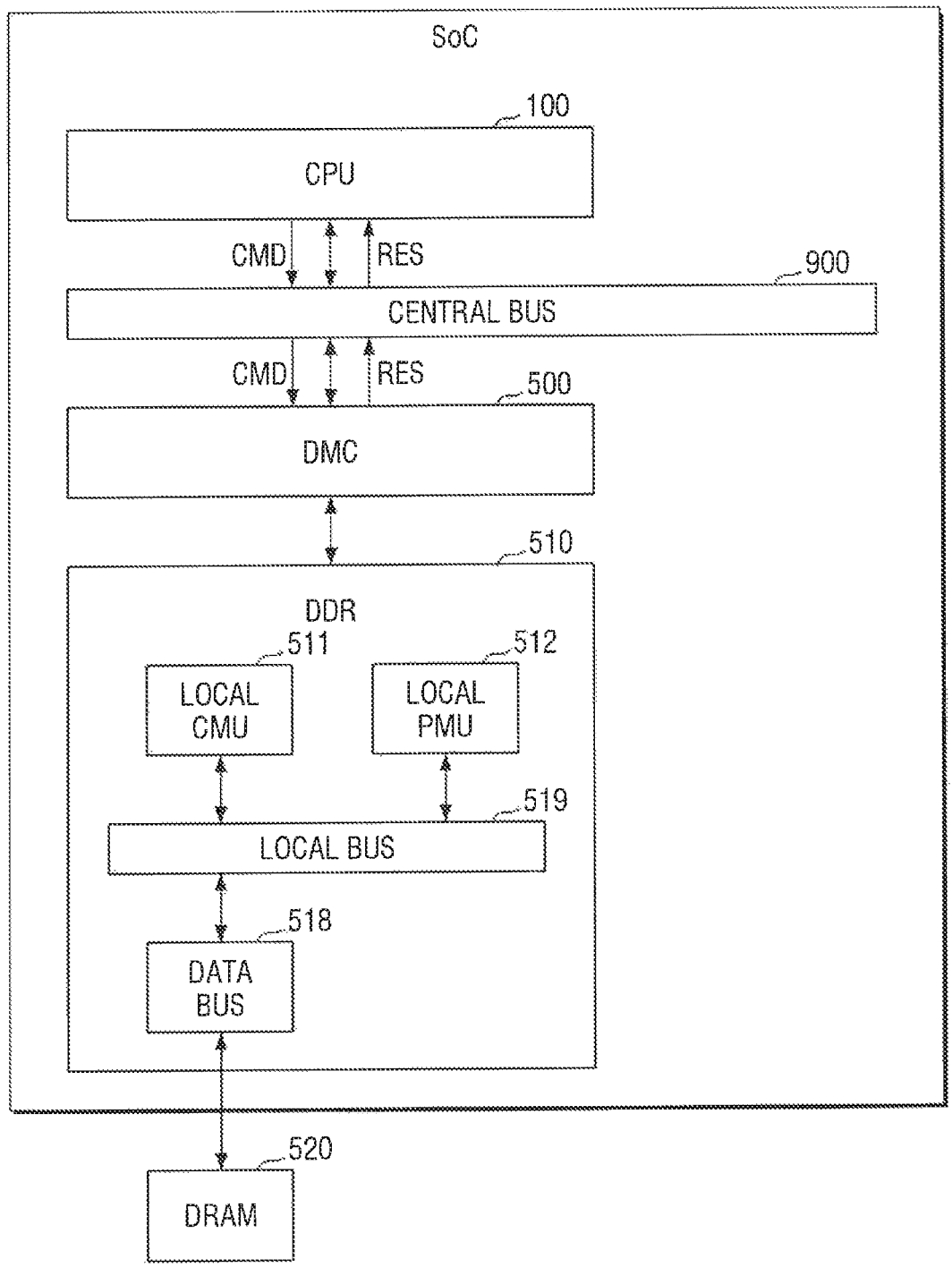
FIG. 14 is a diagram for explaining the test method for a system on chip according to embodiments of the present disclosure.

FIGS. 13 and 14 are diagrams for explaining a test method for system on chip according to embodiments of the present disclosure.

Referring to FIGS. 1 and 3, in the test method for system on chip according to embodiments of the present disclosure, when performing the test on the system on chip, the input driver 26 does not connect the input transactor and the output transactor inside each of the blocks 100, 200, 300, 350, 400, 500, 510, 600, 700, and 800 and the central bus 900.

For example, referring to FIGS. 8 and 13, when performing the test on the system on chip, the CMU block 600 does not include the input transactor 630 and the output transactor 650 as compared to a case of performing the test on the CMU block 600. In other words, devices that are not to be tested do not include input and output transactors.

The input driver 26 may reproduce the input values that are input into each of the blocks 100, 200, 300, 350, 400, 500, 510, 600, 700, and 800 and the central bus 900 while the system on chip is booted up, and may input the input values to each of the blocks 100, 200, 300, 350, 400, 500, 510, 600, 700, and 800 and the central bus 900.

For example, FIG. 14 is a diagram for explaining the case of testing the operation between the CPU block 100, the central bus 900, the DMC block 500, the DDR interface block 510 and a DRAM 520. Referring to FIG. 14, the CPU block 100 may generate the command CMD on the DRAM 520. The DMC block 500 may receive commands CMD through the central bus 900. The DMC block 500 may perform the operation according to the command CMD on the DRAM 520 through the DDR interface block 510 in response to the command CMD. The DMC block 500 may generate a response RES after performing the operation according to the command CMD. The DMC block 500 may provide the response RES to the CPU block 100. The DDR interface block 510 may include a local CMU 511, a local PMU 510 and a data bust 518 connected via a local bus 519.

After the operation of the system on chip is performed, the verifier (27 of FIG. 1) may select the verification path according to the command CMD, and determine the operation result of the system on chip according to the verification path. For example, when the command CMD is a read command, the verifier (27 of FIG. 1) may compare the data included in the response RES provided to the CPU block 100 with the data stored at the address of the DRAM 520 included in the command CMD provided by the CPU block 100 to verify the system on chip.

The test system for a system on chip according to embodiments of the present disclosure may delete the input transactor and the output transactor in the scenario of performing the test operation on the test block, and perform the test operation of the system on chip. In other words, the test operation of the system on chip may be performed, using the scenario of performing the test operation on just the test block.

It is to be understood that those skilled in the art will appreciate that many variations and modifications may be made to the embodiments described herein without departing from the scope of the present disclosure. Therefore, the present disclosure is not limited to the embodiments described herein.

What is claimed is:

1. A test method for a system on chip, the test method comprising:
receiving a system on chip including a plurality of blocks;
booting up the system on chip;
storing input values that are input to each of the plurality of blocks, while booting up the system on chip; and
performing a test on a first block among the plurality of blocks,
wherein performing the test on the first block includes:
disabling components of each of the plurality of blocks except the first block, and
inputting a first input value to the first block to initialize the first block, wherein the first input value is one of the stored input values that was input to the first block while booting-up the system on chip.

2. The test method of claim 1, wherein the system on chip further includes a central bus,
the plurality of blocks are connected to the central bus, and
wherein a component of the central bus is disabled when disabling components of each of the plurality of blocks except the first block.

3. The test method of claim 1, wherein the first input value includes a clock signal, a reset signal, or a setting signal used to set the first block.

4. The test method of claim 3, wherein the clock signal is also provided to the plurality of blocks other than the first block while the system on chip is booted up.

5. The test method of claim 3, wherein the reset signal is provided from outside of the system on chip while the system on chip is booted up.

6. The test method of claim 1, wherein performing the test on the first block includes:
receiving a request to the first block from outside,
generating a transaction in response to the request by the first block, and
performing an operation according to the transaction in response to the transaction by the first block.

7. The test method of claim 1, further comprising:
performing a test on the system on chip,
wherein performing the test on the system on chip includes:
inputting the input values into each of the plurality of blocks to initialize each of the plurality of blocks.

8. The test method of claim 7, wherein the plurality of blocks include the first block, a second block, and a third block that are different from each other,
wherein performing the test on the system on chip includes:
generating a command on the second block by the first block,
performing an operation according to the command on the second block in response to the command by the third block, and
generating a response to the command by the third block.

9. The test method of claim 1, wherein the plurality of blocks include an alive block, and
the alive block is always supplied with power, when power is supplied to the system on chip and the alive block is the first block.

10. A test system for a system on chip, the test system comprising:
a processor; and
a system on chip including a plurality of blocks, and a memory in which a test bench for performing a test on the system on chip is stored,
wherein the test bench includes:
an input port monitor that boots up the system on chip, and stores input values which are input to each of the plurality of blocks while the system on chip is booted up,
an input driver that disables components of each of the plurality of blocks except a test block among the plurality of blocks, and inputs a first input value to be input into the test block during booting-up of the system on chip among the stored input values to the test block, thereby initializing the test block, and a verifier that performs verification on the test block on the basis of an operation result of the initialized test block.

11. The test system of claim 10, wherein the system on chip further includes a central bus,
the plurality of blocks are connected to the central bus, and
the input driver further disables components of the central bus.

12. The test system of claim 10, wherein the input driver further connects an input transactor and an output transactor to a local bus in the test block,
the input transactor generates a transaction according to a request provided from the outside, and
the output transactor generates a response to the request.

13. The test system of claim 12, wherein the input driver disconnects the input transactor and the output transactor from the test block, and inputs respective ones of the input values to each of the plurality of blocks to initialize the system on chip, and
the verifier performs a verification on the system on chip on the basis of an operation result of the initialized system on chip.

14. The test system of claim 10, wherein the first input value includes a clock signal, a reset signal, a first signal that is variable during booting-up of the system on chip and has a fixed value after the booting-up of the system on chip is completed or during booting-up of the system on chip, a second signal having a fixed value, and a third signal to be toggled.

15. The test system of claim 14, wherein the input driver inputs the clock signal, the reset signal, the first signal having the fixed value, the second signal having the fixed value, and the third signal to be toggled to test block.

16. The test system of claim 10, wherein at least one of the input values is provided from the plurality blocks of the system on chip other than the test block while the system on chip is booted up.

17. The test system of claim 10, Wherein at least one of the input values is provided from outside the system on chip while the system on chip is booted up.

18. A test system for a system on chip, the test system comprising:
a processor; and
a system on chip including a plurality of blocks, and a memory in which a test bench for performing a test on the system on chip is stored,
wherein the test bench includes:
an input port monitor that boots up the system on chip, and stores input values to be input to each of the plurality of blocks while the system on chip is booted up, and
an input driver,
when performing the test on one block of the plurality of blocks, the input driver inputs the input value to be input to the one block during booting-up of the system on chip among the input values to the one Hock, and disables each component of the remaining blocks except the one block of the plurality of blocks, and
when performing the test on the system on chip, the input driver inputs the input values to each of the plurality of blocks.

19. The test system of claim 18, wherein when performing the test on the one block, the input driver further connects an input transactor and an output transactor to a local bus in the one block,
when performing the test on the system on chip, the input driver does not connect the input transactor and the output transactor to the local bus in each of the plurality of blocks,
the input transactor generates a transaction according to a request provided from the outside, and
the output transactor generates a response to the request.

20. The test system of claim 18, wherein the system on chip further includes a central bus,
the plurality of blocks are connected to the central bus,
the input port monitor further stores central bus input values to be input to the central bus while the system on chip is booted up,
the input driver disables a component of the central bus when performing the test on the one block, and
the input driver inputs the central bus input values to the central bus when performing the test on the system on chip.

* * * * *